United States Patent
Kim et al.

(10) Patent No.: US 9,577,017 B2
(45) Date of Patent: Feb. 21, 2017

(54) ORGANIC LIGHT EMITTING DIODE DISPLAY

(71) Applicant: Samsung Display Co., Ltd., Yongin (KR)

(72) Inventors: Sang Woo Kim, Cheonan-si (KR); Nam Jin Kim, Suwon-si (KR); Yong-Kyu Jang, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 71 days.

(21) Appl. No.: 14/259,945

(22) Filed: Apr. 23, 2014

(65) Prior Publication Data

US 2015/0069341 A1    Mar. 12, 2015

(30) Foreign Application Priority Data

Sep. 9, 2013    (KR) .................. 10-2013-0107953

(51) Int. Cl.
*H01L 27/32* (2006.01)
*H01L 51/52* (2006.01)

(52) U.S. Cl.
CPC ....... *H01L 27/3267* (2013.01); *H01L 51/5203* (2013.01); *H01L 51/5234* (2013.01); *H01L 51/5265* (2013.01); *H01L 27/3244* (2013.01); *H01L 2251/5338* (2013.01); *H01L 2251/558* (2013.01)

(58) Field of Classification Search
CPC ............ H01L 27/3267; H01L 51/5203; H01L 51/5265; H01L 51/5234; H01L 27/3246; H01L 51/5281; H01L 51/5237

USPC ......... 257/40; 313/506, 483, 500, 501, 502, 313/503, 504, 505
See application file for complete search history.

(56) References Cited

U.S. PATENT DOCUMENTS

| | | |
|---|---|---|
| 2008/0067926 A1 | 3/2008 | Mizuno et al. |
| 2010/0051973 A1* | 3/2010 | Kobayashi .......... H01L 51/5092 257/88 |
| 2010/0084969 A1* | 4/2010 | Choi ................... H01L 51/0022 313/504 |
| 2010/0320481 A1 | 12/2010 | Kashiwabara |
| 2011/0175097 A1* | 7/2011 | Song ................... H01L 27/326 257/59 |

(Continued)

FOREIGN PATENT DOCUMENTS

| | | |
|---|---|---|
| DE | 102012211232 | 1/2013 |
| KR | 10-2001-0105733 | 11/2001 |

(Continued)

OTHER PUBLICATIONS

Europen Search Report—European Patent Application No. 14181128.1 dated Mar. 26, 2015.

*Primary Examiner* — David Vu
*Assistant Examiner* — Mouloucoulaye Inoussa
(74) *Attorney, Agent, or Firm* — Cantor Colburn LLP

(57) ABSTRACT

An organic light emitting diode ("OLED") display includes: a front display part including a plurality of front pixels disposed on a substrate, where the front pixels display an image on a front surface thereof; and a side display part including a plurality of side pixels disposed on the substrate, where the side pixels display an image on a side surface thereof, where the front display part and the side display part are configured to have different resonance structures from each other.

6 Claims, 7 Drawing Sheets

(56) References Cited

U.S. PATENT DOCUMENTS

2011/0215712 A1*  9/2011  Hong ................... H01J 1/62
                                                    313/504
2013/0002133 A1*  1/2013  Jin ..................... G06F 1/169
                                                    313/511

FOREIGN PATENT DOCUMENTS

KR   10-2010-0017578   2/2010
KR   10-2011-0093451   8/2011

* cited by examiner

ORGANIC LIGHT EMITTING DIODE DISPLAY

This application claims priority to Korean Patent Application No. 10-2013-0107953 filed on Sep. 9, 2013, and all the benefits accruing therefrom under 35 U.S.C. §119, the contents of which are incorporated by reference herein in its entirety.

BACKGROUND

1. Field

The described technology relates generally to an organic light emitting diode ("OLED") display.

2. Description of the Related Art

An organic light emitting diode ("OLED") display typically includes two electrodes and an organic light emitting member disposed therebetween. Electrons injected from one of the two electrodes and holes injected from the other of the two electrodes are combined in the organic light emitting member to form excitons, and light is emitted from the organic light emitting member as the excitons release energy.

For applying the OLED display to various types of applications, a flexible OLED display which can be easily flexible has been manufactured. Among the flexible OLED display, a bendable OLED display has a structure including a front display part embodied to have no dead space even when it is bent at an edge of the front display part and a side display part which is visible from the side.

A bottom light emission type of OLED display, in which light emitted from an organic material is downwardly transferred to a positive electrode, has a smaller color gamut and lower luminous efficiency than those of a top light emission type of OLED display, in which the light is transferred to a negative electrode. Accordingly, a microcavity structure may be applied to the bottom light emission type of OLED display.

By applying the microcavity structure, light beams are repeatedly reflected between a reflection layer and a transflective layer to generate a strong interference effect such that light beams having a specific wavelength range are amplified while other light beams are offset. The OLED display, to which the microcavity structure is applied, has high color purity at the front.

The viewing angle characteristic at the side of the OLED display, to which the microcavity structure is applied, is substantially reversely proportional to the viewing angle characteristic at the front thereof. That is, the color purity is reduced.

When an additional optical film is provided in a predetermined position, or an additional structure is provided below the OLED display to compensate the reduced color purity, manufacturing cost may be increased, and production yield may be reduced.

SUMMARY

Exemplary embodiments of the invention provide an organic light emitting diode ("OLED") display having different color characteristic without using an additional structure by applying a low resonance structure to a bent region, thereby improving visibility.

An exemplary embodiment provides an OLED display including: a front display part including a plurality of front pixels disposed on a substrate, where the front pixels display an image on a front surface thereof; and a side display part including a plurality of side pixels, where the side pixels display an image on a side surface thereof, where the front display part and the side display part are configured to have different resonance structures from each other.

In an exemplary embodiment, the front display part may have a high resonance structure, and the side display part may have a low resonance structure.

In an exemplary embodiment, each of the front pixels and the side pixels may include: a plurality of thin film transistors disposed on the substrate; a protective layer configured to cover the thin film transistors; a first electrode disposed on the protective layer; a pixel definition film disposed on the first electrode, where an opening, which exposes the first electrode on the protective layer, is defined through the pixel definition film; an organic emission layer disposed on the first electrode and in the opening of the pixel definition film; and a second electrode configured to cover the organic emission layer, where the second electrode of the side pixels may be thinner than the second electrode of the front pixels.

In an exemplary embodiment, the side display part may have a thickness which decreases as it goes from the front display part to an end portion of the side display part.

In an exemplary embodiment, each of the front pixels and the side pixels may include: a plurality of thin film transistors disposed on the substrate; a protective layer configured to cover the thin film transistors; a first electrode formed on the protective layer; a pixel definition film having an opening which exposes the first electrode formed on the protective layer; an organic emission layer formed on the first electrode and the pixel definition film; and a second electrode configured to cover the organic emission layer, where the second electrode of the front pixel may include a material having higher reflectivity than a material of the second electrode of the side pixel.

In an exemplary embodiment, each of the front pixels and the side pixels may include: a plurality of thin film transistors disposed on the substrate; a protective layer configured to cover the thin film transistors; a first electrode disposed on the protective layer; a pixel definition film disposed on the first electrode, where an opening, which exposes the first electrode on the protective layer, is defined through the pixel definition layer; an organic emission layer disposed on the first electrode and in the opening of the pixel definition film; and a second electrode configured to cover the organic emission layer, where the second electrode of the front pixel may include a material having a lower color deviation than a material of the second electrode of the side pixel.

In the exemplary embodiments described herein, an OLED display has improved visibility at a bent region.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1:
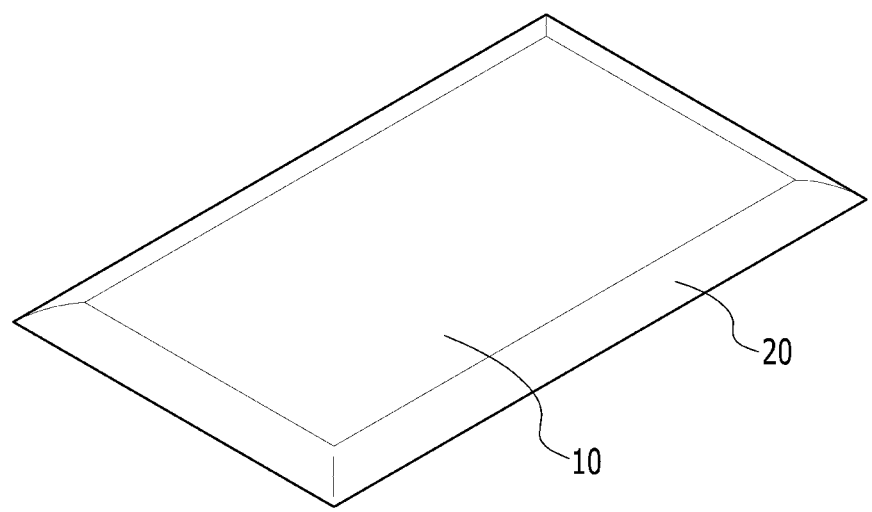
FIG. 1 is a perspective of an exemplary embodiment of an organic light emitting diode ("OLED") display, according to the invention.

The invention will be described more fully hereinafter with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

In addition, in the accompanying drawings, exemplary embodiments, where an organic light emitting diode ("OLED") display is a two transistor-one capacitor ("2Tr-1Cap") structured active matrix ("AM") type of OLED, in which a pixel includes two thin film transistors ("TFT") and one capacitor, are illustrated. However, the invention is not limited thereto. In an alternative exemplary embodiment, an OLED display may have various structures, in which a pixel may include a plurality of TFTs and a capacitor, a wiring line may be further provided, and a conventional wiring line may be omitted. Herein, a pixel refers to a minimum unit that displays an image, and an OLED display displays an image through a plurality of pixels.

Hereinafter, exemplary embodiments of an OLED display, according to the invention, will be described with reference to FIG. 1 to FIG. 7.

Figure 2:
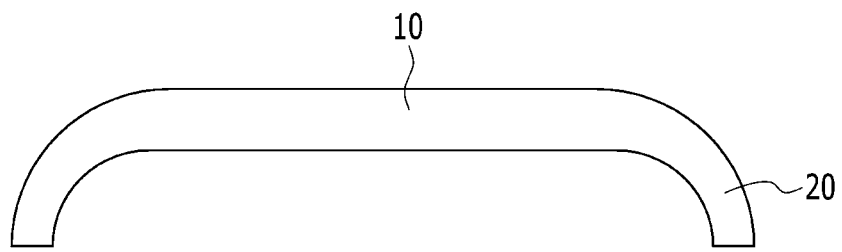
FIG. 2 is a side view of an exemplary embodiment of the OLED display, according to the invention.

FIG. 1 is a perspective view of an exemplary embodiment of an OLED display, according to the invention. FIG. 2 is a side view of an exemplary embodiment of the OLED display, according to the invention.

As shown in FIG. 1 and FIG. 2, an exemplary embodiment of the OLED display may include a front display part 10 that displays an image at a front thereof, and a side display part 20 that extends from opposite ends of the front display part 10 and having a bent region.

In such an embodiment, the OLED display including the front display part 10 and the side display part 20 has no dead space where no image is embodied.

However, as shown in FIG. 2, in the front display part 10, the color gamut and luminous efficiency are optimized at the front having a viewing angle of about zero (0) degree, while the color purity in the side display part 20 may be reduced due to the viewing angle.

The structures of an exemplary embodiment of the OLED display, where front pixels A1 and side pixels A2 respectively disposed in the front display part 10 and the side display part 20 to allow the side display part 20 to have maximum color purity at a predetermined viewing angle, will be described with reference to FIG. 3 to FIG. 5.

Figure 3:
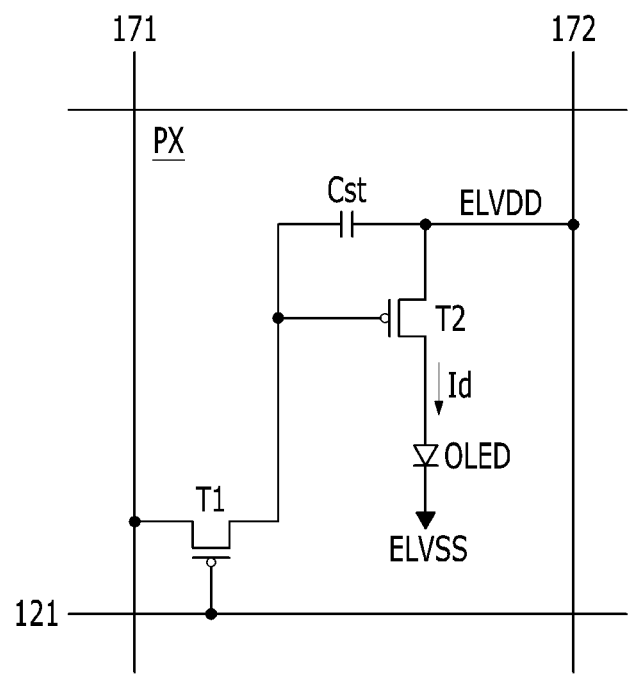
FIG. 3 is an equivalent circuit diagram showing a pixel of an exemplary embodiment of the OLED display, according to the invention.

FIG. 3 is an equivalent circuit diagram showing a pixel of an exemplary embodiment of the OLED display, according to the invention.

Figure 4:
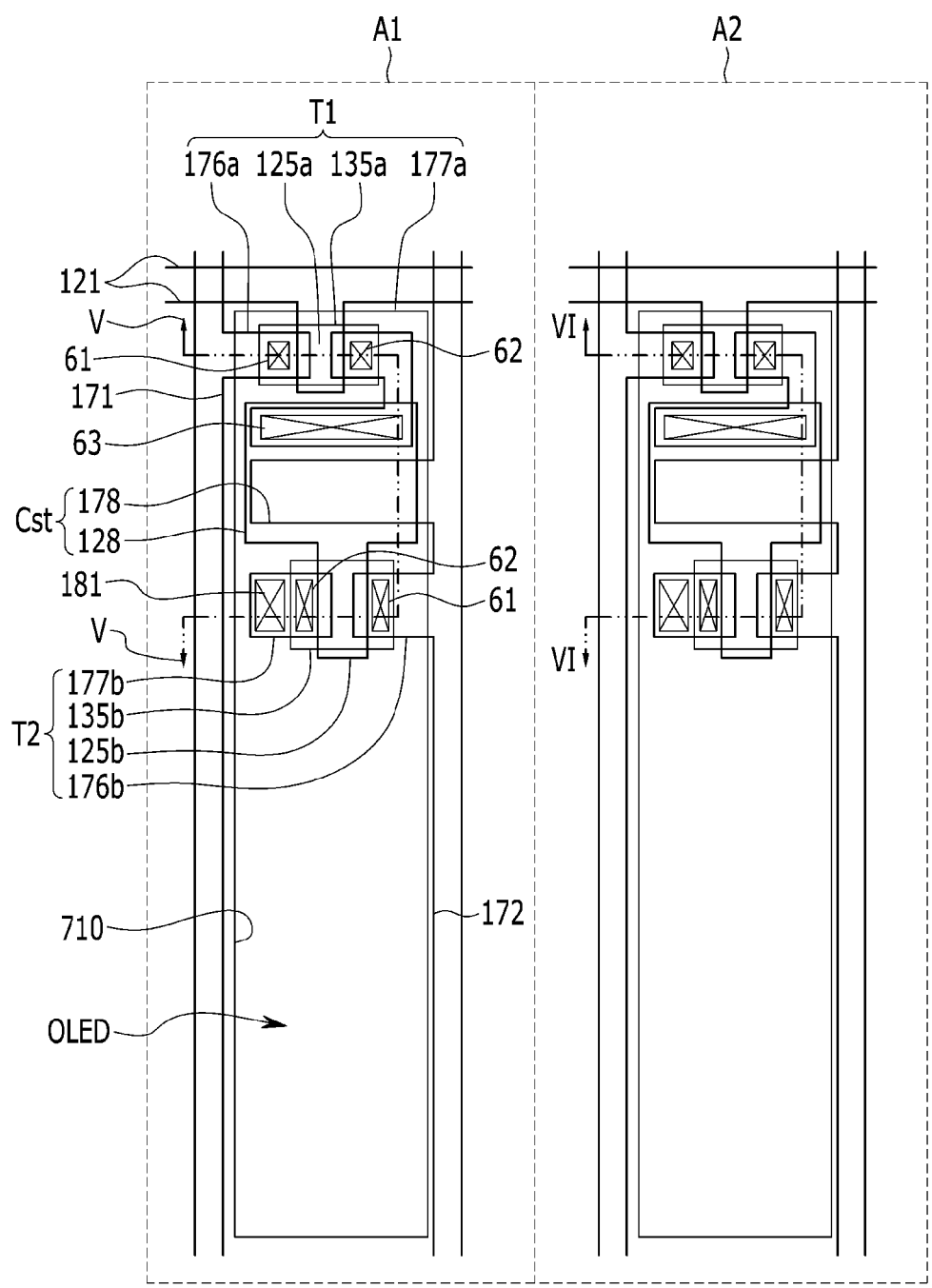
FIG. 4 is a plan view showing a front pixel A1 and a side pixel A2, which are respectively located in a front display part and a side display part of an exemplary embodiment of the OLED display, according to the invention.

In such an embodiment, as shown in FIG. 3, the OLED display includes a plurality of signal lines 121, 171 and 172, and a plurality of pixels PX, e.g., the front pixel A1 and the side pixel A2 shown in FIG. 4, connected thereto and arranged substantially in a matrix form.

The signal lines include a plurality of scan lines 121 for transmitting scan signals (or gate signals), a plurality of data lines 171 for transmitting data signals, and a plurality of driving voltage lines 172 for transmitting a driving voltage ELVDD.

Referring to FIG. 3, the scan lines 121 extend substantially in a row direction and are arranged substantially parallel to each other, and the data lines 171 and the driving voltage lines 172 extend substantially in a column direction and are arranged substantially parallel to each other.

In an exemplary embodiment, each of the pixels PX includes a switching thin film transistor T1, a driving thin film transistor T2, a storage capacitor Cst and an OLED.

The switching thin film transistor T1 has a control terminal, an input terminal and an output terminal. The control terminal of the switching thin film transistor T1 is connected to a corresponding scan line 121, the input terminal of the switching thin film transistor T1 is connected to a corresponding data line 171, and the output terminal of the switching thin film transistor T1 is connected to the driving thin film transistor T2. The switching thin film transistor T1 transmits a data signal applied to the corresponding data line 171 to the driving thin film transistor T2 in response to a scan signal applied to the corresponding scan line 121.

The driving thin film transistor T2 has a control terminal, an input terminal, and an output terminal. The control terminal of the driving thin film transistor T2 is connected to the switching thin film transistor T1, the input terminal of the driving thin film transistor T2 is connected to the corresponding driving voltage line 172, and the output terminal of the driving thin film transistor T2 is connected to the OLED. The driving thin film transistor T2 generates an output current Id that flows to the OLED, and amplitude of the current varies in accordance with a voltage applied between the control terminal and the output terminal of the driving thin film transistor T2.

The storage capacitor Cst is connected between the control terminal and input terminal of the driving thin film transistor T2. The storage capacitor Cst charges a data signal applied to the control terminal of the driving thin film transistor T2, and maintains the data signal after the switching thin film transistor T1 is turned off.

The OLED has an anode connected to the output terminal of the driving thin film transistor T2 and a cathode connected to a common voltage ELVSS. The OLED displays an image by emitting light with various intensities according to the output current Id from the driving thin film transistor T2.

The switching thin film transistor T1 and the driving thin film transistor T2 may be n-channel field effect transistors ("FET"s) or p-channel FETs.

In an alternative exemplary embodiment, the connection relationship among the thin film transistors T1 and T2, the storage capacitor Cst, and the OLED may be variously modified.

Structures of the front pixel A1 and the side pixel A2 of the OLED display of FIG. 3 will now be described in greater detail with reference to FIG. 4 to FIG. 6 as well as FIG. 3.

FIG. 4 is a plan view of a front pixel A1 and a side pixel A2, which are respectively located in a front display part and a side display part of an exemplary embodiment of the OLED display, according to the invention. FIG. 5 is a cross-sectional view taken along line V-V of the OLED display of FIG. 4. FIG. 6 is cross-sectional view taken along VI-VI of the OLED display of FIG. 4. FIG. 7 is a CIE xy chromaticity diagram according to thickness of common electrodes of the front pixel A1 and the side pixel A2 of an exemplary embodiment of the OLED display, according to the invention.

Figure 5:
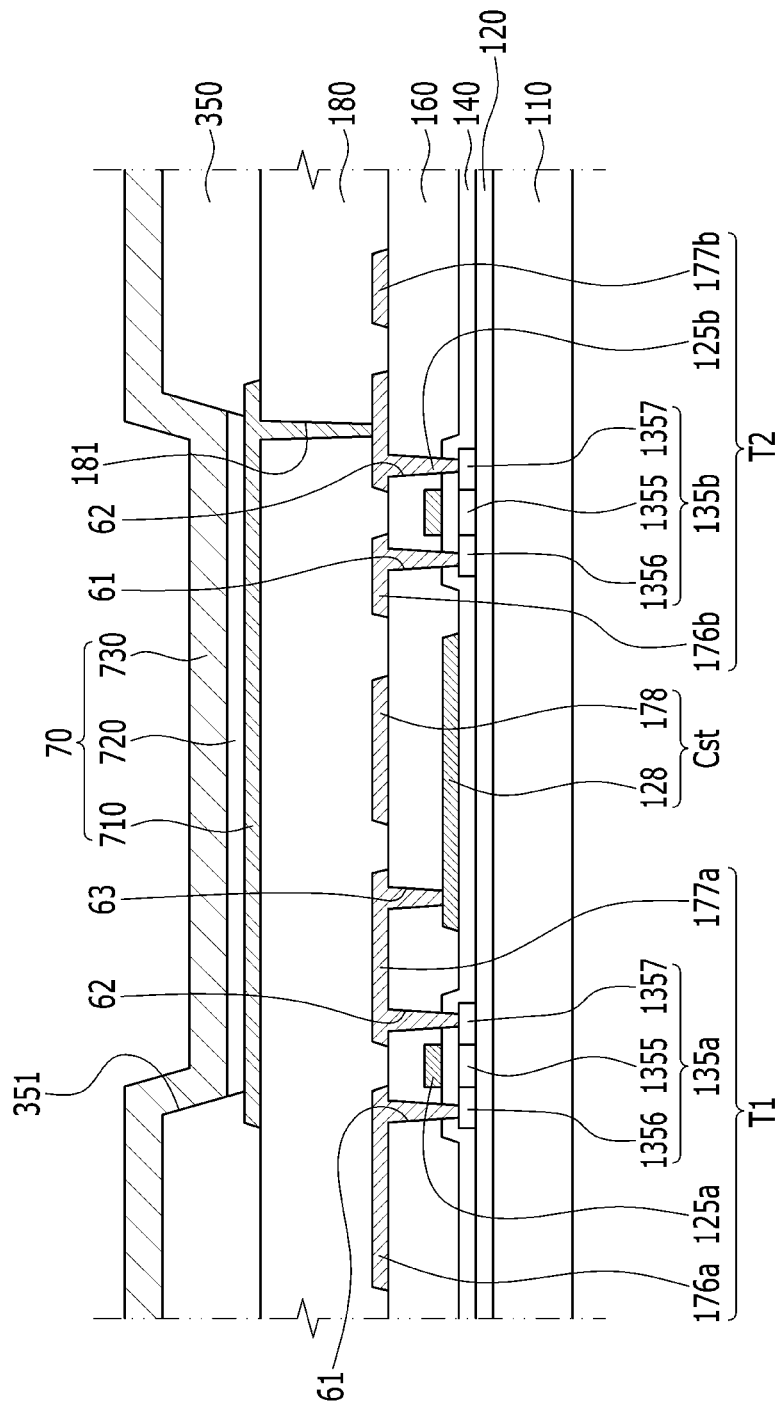
FIG. 5 is a cross-sectional view taken along line V-V of the OLED display of FIG. 4.
Figure 6:
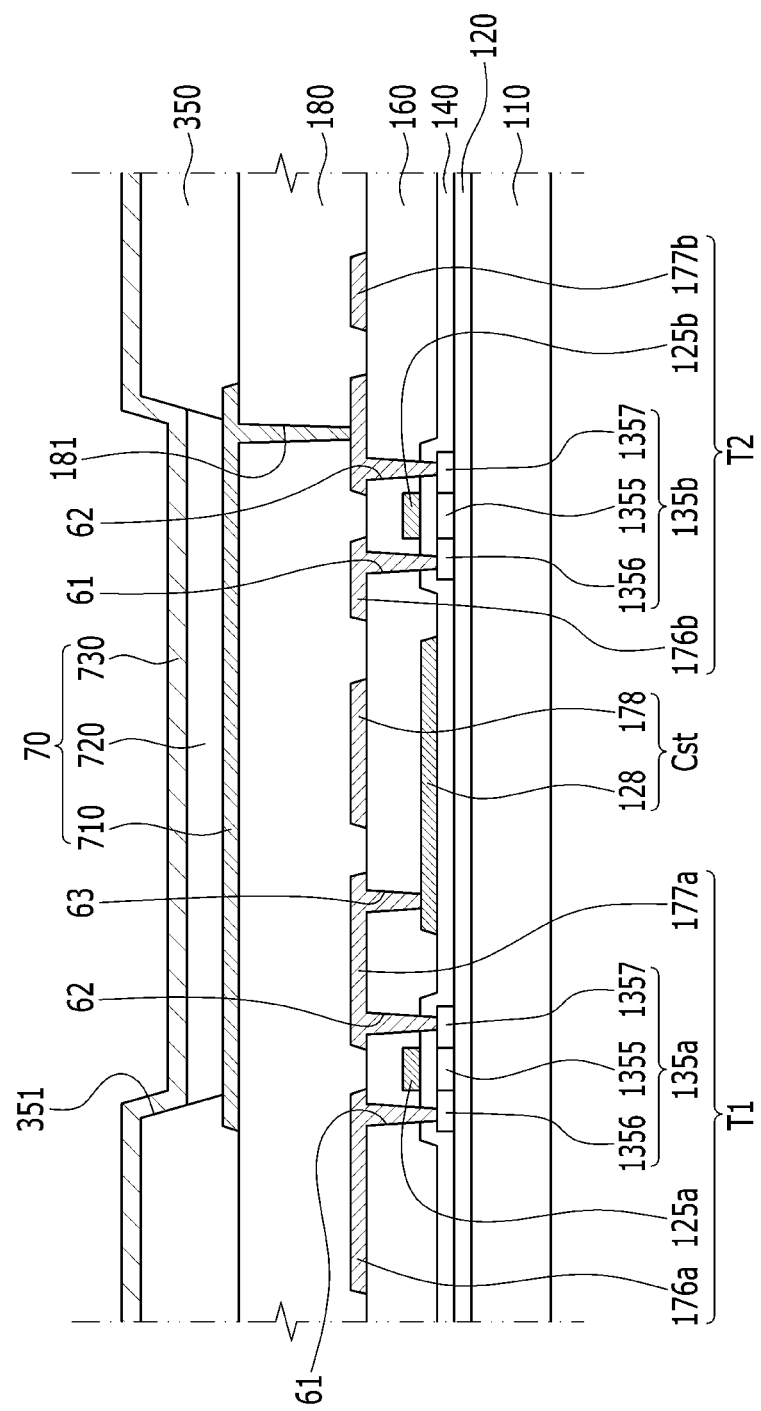
FIG. 6 is cross-sectional view taken along VI-VI of the OLED display of FIG. 4.
Figure 7:
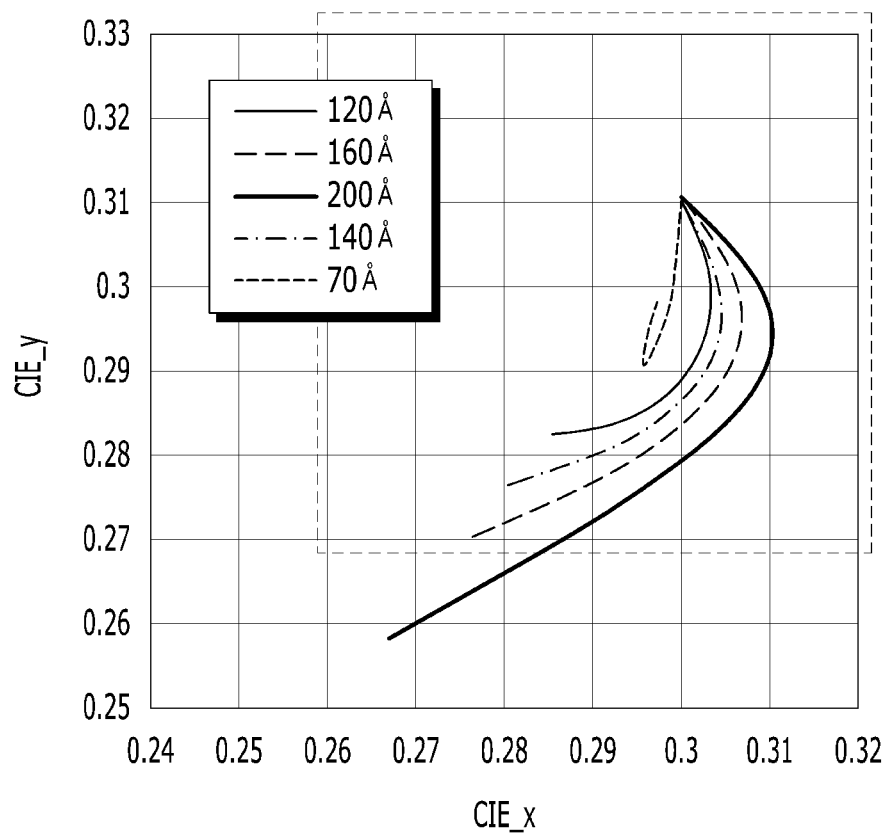
FIG. 7 is a CIE xy chromaticity diagram according to thickness of common electrodes of the front pixel A1 and the side pixel A2 of an exemplary embodiment of the OLED display, according to the invention.

As shown in FIG. 4 to FIG. 6, in an exemplary embodiment of the OLED display, a buffer layer 120 is disposed on a substrate 110 of the front pixel A1 and the side pixel A2.

The substrate 110 may be an insulating substrate including glass, quartz, ceramic, or plastic, for example.

The buffer layer 120 effectively prevents contaminants such as impure elements or moisture from intruding into inside of the OLED display, and has a planarized surface. The buffer layer 120 may have a single-layered structure of a silicon nitride (SiNx), or a double-layered structure of a silicon nitride (SiNx) and a silicon oxide ($SiO_x$), for example.

A switching semiconductor layer 135a and a driving semiconductor layer 135b are disposed on the buffer layer 120, and the switching semiconductor layer 135a and the driving semiconductor layer 135b are spaced apart from each other. The switching and driving semiconductor layers 135a and 135b may include polysilicon or an oxide semiconductor, for example.

The oxide semiconductor may include an oxide based on titanium (Ti), hafnium (Hf), zirconium (Zr), aluminum (Al), tantalum (Ta), germanium (Ge), zinc (Zn), gallium (Ga), tin (Sn) or indium (In), or a complex oxide thereof, for example, zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O) or hafnium-indium-zinc oxide (Hf—In—Zn—O).

In an exemplary embodiment, where the semiconductor layers 135a and 135b include an oxide semiconductor, a separate protective layer may be included to protect the oxide semiconductor from an outside environment such as a high temperature.

Each of the semiconductor layers 135a and 135b includes a channel region, which is not doped with impurities, and source and drain regions, which are doped with impurities and disposed at opposing sides of the channel region. The impurities vary according to the type of thin film transistors, and may be N-type impurities or P-type impurities.

In such an embodiment, as shown in FIGS. 5 and 6, each of the switching semiconductor layer 135a and the driving semiconductor layer 135b is divided into a channel region 1355, and a source region 1356 and a drain region 1357 disposed at opposing sides of the channel region 1355. The channel regions 1355 of the switching semiconductor layer 135a and the driving semiconductor layer 135b may include polysilicon, which is not doped with impurities, that is, intrinsic semiconductors, and the source regions 1356 and drain regions 1357 of the switching semiconductor layer 135a and the driving semiconductor layer 135b may include polysilicon, which is doped with conductive impurities, that is, impurity semiconductors.

In such an embodiment, a gate insulating film 140 is disposed on the switching semiconductor layer 135a and the driving semiconductor layer 135b. The gate insulating film 140 may include a silicon nitride or a silicon oxide, for example, and may have a single-layer structure or a multi-layer structure.

A scan line 121, a driving gate electrode 125b and a first storage capacitor plate 128 are disposed on the gate insulating film 140. The scan line 121 longitudinally extends substantially in a horizontal direction and transfers a scan signal, and includes a switching gate electrode 125a that protrudes from the scan line 121 toward the switching semiconductor layer 135a. A driving gate electrode 125b protrudes from the first storage capacitor plate 128 toward the driving semiconductor layer 135b. The switching gate electrode 125a and the driving gate electrode 125b overlap the channel regions 1355, respectively.

An interlayer insulating film 160 is disposed on the scan line 121, the driving gate electrode 125b and a first storage capacitor plate 128. In such an embodiment, the interlayer insulating film 160 may include a silicon nitride or a silicon oxide, for example.

Source contact holes 61 and drain contact holes 62 are defined in the interlayer insulating film 160 and the gate insulating film 140 to expose the source regions 1356 and the drain regions 1357, and storage contact holes 63 are defined in the interlayer insulating film 160 and the gate insulating film 140 to expose part of the first storage capacitor 128.

A data line 171 including a switching source electrode 176a, a driving voltage line 172 including a driving source electrode 176b and a second storage capacitor plate 178, and a switching drain electrode 177a and a driving drain electrode 177b that are connected to the first storage capacitor plate 128a are disposed on the interlayer insulating film 160.

The data line 171 transfers a data signal and extends substantially in a direction crossing the gate line 121. The driving voltage line 172 transfers a driving voltage, and is spaced apart from the data line 171 and extends substantially in the same direction as the data line 171.

The switching source electrode 176a protrudes from the data line 171 toward the switching semiconductor layer 135a, and the driving source electrode 176b protrudes from the driving voltage line 172 toward the driving semiconductor layer 135b. The switching source electrode 176a and the driving source electrode 176b are respectively connected to the source regions 1356 through the source contact holes 61. The switching drain electrode 177a faces the switching source electrode 176a, the driving drain electrode 177b faces the driving source electrode 176b, and the switching drain electrode 177a and the driving drain electrode 177b are respectively connected to the drain regions 1357 through the drain contact holes 62.

The switching drain electrode 177a is extended toward the first storage capacitor plate 128 and electrically connected to the first storage capacitor plate 128 and the driving gate electrode 125b through the storage contact hole 63 defined in the interlayer insulating film 160.

The second storage capacitor plate 178 protrudes from the driving voltage line 171, and overlaps the first storage capacitor plate 128. Accordingly, the first storage capacitor plate 128 and the second storage capacitor plate 178 collectively define the storage capacitor Cst with the interlayer insulating film 160, which is disposed therebetween, as a dielectric material.

The switching semiconductor layer 135a, the switching gate electrode 125a, the switching source electrode 176a and the switching drain electrode 177a collectively define the switching thin film transistor T1, and the driving semiconductor layer 135b, the driving gate electrode 125a, the driving source electrode 176b and the driving drain electrode 177b collectively define the driving thin film transistor T2.

A protective layer 180 is disposed on the second storage capacitor plate 178, the switching source electrode 176a, the driving source electrode 176b, the switching drain electrode 177a and the driving drain electrode 177b.

A pixel electrode 710 is disposed on the protective layer 180 as a first electrode of the OLED display, and the pixel electrode 710 may include a transparent conducting material such as indium tin oxide ("ITO"), indium zinc oxide ("IZO"), zinc oxide ("ZnO") or indium oxide ($In_2O_3$), for example, or a reflective metal such as lithium (Li), calcium (Ca), lithium fluoride/calcium (LiF/Ca), lithium fluoride/aluminum (LiF/Al), aluminum (Al), silver (Ag), magnesium (Mg) or gold (Au), for example. The pixel electrode 710 is electrically connected to the driving drain electrode 177b of the driving thin film transistor T2 through a contact hole 181 defined in the interlayer insulating film 160, and functions as an anode of the OLED.

A pixel definition layer 350 is disposed on edge portions of the pixel electrode 710 and the protective layer 180. An opening 351 is defined in the pixel definition film 350 to expose the pixel electrode 710.

In an exemplary embodiment, the pixel definition film 350 may include a resin such as a polyacrylate resin or a polyimide resin, a silica-based inorganic material, or the like, for example.

An organic emission layer 720 is disposed in the opening 351 of the pixel definition layer 350.

The organic emission layer 720 includes at least one of a plurality of layers including an emission layer, a hole injection layer ("HIL"), a hole transport layer ("HTL"), an electron transport layer ("ETL") and an electron injection layer ("EIL"). In an exemplary embodiment, the organic emission layer 720 includes emission layer, the HIL, the HTL, the ETL and the EIL, the HIL may be disposed on the pixel electrode 710, that is, the anode, and the HTL, the emission layer, the ETL, and the EIL may be sequentially stacked on the HIL.

In an exemplary embodiment, the organic emission layer 720 may include a red organic emission layer for emitting red light, a green organic emission layer for emitting green light or a blue organic emission layer for emitting blue light, and the red organic emission layer, the green organic emission layer and the blue organic emission layer are respectively formed in red, green and blue pixels, thereby displaying a color image.

In an alternative exemplary embodiment, the red organic emission layer, green organic emission layer and blue organic emission layer of the organic emission layer 720 may be laminated on each of the red pixel, green pixel and blue pixel, and a red color filter, a green color filter and a blue color filter may be provided for the red, green and blue pixels, respectively, thereby displaying a color image.

In another alternative exemplary embodiment, a white organic emission layer for emitting white light may be disposed in all of the red, green and blue pixels, and a red color filter, a green color filter and a blue color filter may be provided for the red, green and blue pixels, respectively, thereby displaying a color image. In such an embodiment, where the pixels include the white organic emission layer and the color filters to display a color image, a deposition process using a mask for depositing the red, green and blue organic emission layers on the respective pixels, i.e., the red, green and blue pixels may be omitted.

In such an embodiment, the white organic emission layer may include a single organic emission layer or a plurality of organic emission layers that are laminated to emit white light. In such an embodiment, a yellow organic emission layer and a blue organic emission layer may be combined to emit white light, a cyan organic emission layer and a red organic emission layer may be combined to emit white light, or a magenta organic emission layer and a green organic emission layer may be combined to emit white light, for example, but not being limited thereto.

A common electrode 730 is disposed on the pixel definition layer 350 and the organic emission layer 720 as a second electrode of the OLED display. In an exemplary embodiment, the common electrode 730 may function as a cathode of the OLED.

In an exemplary embodiment, as shown in FIG. 5 and FIG. 6, the common electrode 730 disposed in the side pixel A2 is thinner than the common electrode 730 disposed in the front pixel A1 such that a low resonance (weak resonance) structure or a non-resonance structure is provided in the side pixel A2 by reducing reflectivity and increasing transmittance.

When both of the front pixel A1 and the side pixel A2 have a high resonance (strong resonance) structure, a color shift phenomenon occurs according to a viewing angle thereof, e.g., a white color in a front direction is viewed as a bluish color at a viewing angle of about 60 degrees. Accordingly, in an OLED display where a display part is bent, the front and side may be respectively viewed as a white color and a bluish color due to the bending angle.

In an exemplary embodiment of the invention, various methods may be used for adjusting a high or low resonance level. In an exemplary embodiment of the OLED display, thickness of the common electrode 730 of the front pixel A1 and the low pixel A2 is differently set to change reflectivity and a resonance condition according to the reflectivity, thereby reducing color deviation.

In FIG. 7, CIE xy chromaticity curves when the thickness of the common electrode 730 is about 70 angstroms (Å), about 120 Å, about 140 Å, about 160 Å, and about 200 Å are shown.

As shown in FIG. 7, the color deviation is reduced as the thickness of the common electrode 730 decreases.

Accordingly, in such an embodiment, the front pixel and the side pixel are effectively compensated to display an image with the maximum color purity independently of the bending angle by configuring the common electrode 730 in the front side A1 to have the high resonance structure and the common electrode 730 in the front side A2 to have the low resonance structure.

The common electrode 730 may include a transparent conducting material such as ITO, IZO, zinc oxide (ZnO), or indium oxide ($In_2O_3$), for example, or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au), for example.

The pixel electrode 710, the organic emission layer 720 and the common electrode 730 collectively define the OLED 70.

In an exemplary embodiment of the OLED display, the microcavity condition is changed by controlling the thickness of the common electrode 730 of the front pixel A1 and the side pixel A2, as described above. In an alternative exemplary embodiment, the microcavity condition may be changed by controlling the materials of the common electrode 730 of the front pixel A1 and the side pixel A2.

Figure 8:
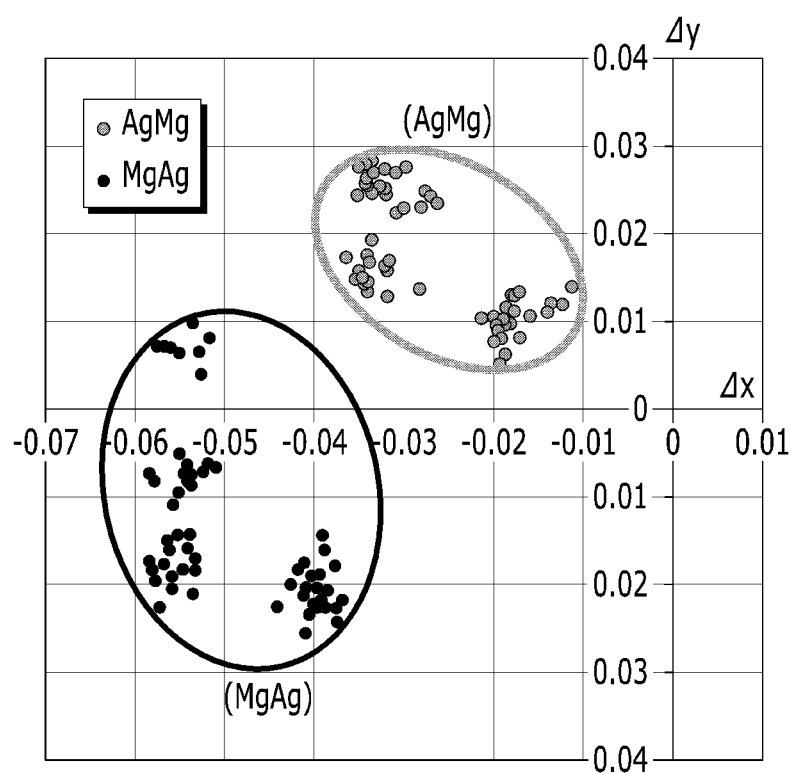
FIG. 8 is a graph showing a color coordinate variation depending on a material of a common electrode in an alternative exemplary embodiment of an OLED display, according to the invention.

FIG. 8 is a graph showing a color coordinate variation depending on a material of a common electrode in an alternative exemplary embodiment of an OLED display, according to the invention.

In such an embodiment, as described above, the common electrode 730 may include a transparent conducting material such as ITO (, IZO, zinc oxide (ZnO), or indium oxide ($In_2O_3$), for example, or a reflective metal such as lithium (Li), calcium (Ca), lithium fluoride/calcium (LiF/Ca), lithium fluoride/aluminum (LiF/Al), aluminum (Al), silver (Ag), magnesium (Mg) or gold (Au), for example.

In an exemplary embodiment, the common electrode of the front pixel may include a material having higher reflectivity than a material of the common electrode of the side pixel. In an alternative exemplary embodiment, the common electrode of the front pixel may include a material having a lower color deviation than a material of the common electrode of the side pixel In FIG. 8, the change of color coordinates obtained when the common electrode is made of AgMg (where Ag:Mg is about 9:1) and MgAg (where Mg:Ag is about 9:1) is shown.

In FIG. 8, $\Delta x$ in the x-coordinate and $\Delta y$ in the y-coordinate indicate color deviations of light incident thereto in a color coordinate.

As shown in FIG. 8, a color deviation of the common electrode made of AgMg (where Ag:Mg is about 9:1) is less than a color deviation of the common electrode made of MgAg (where Mg:Ag is about 9:1).

To decrease the color deviation in the bent region, e.g., the side pixel, the front display part and the side display part may have the high resonance structure and the low resonance structure by configuring the common electrode of the side pixel with AgMg (Ag:Mg is 9:1) having the smaller color deviation and the common electrode of the front pixel with MgAg (Mg:Ag is 9:1) having the larger color deviation. Accordingly, in such an embodiment, the front pixel and the side pixel are effectively compensated to display an image with the maximum color purity independently of the bending angle.

In such an embodiment, the common electrodes of the front and side pixels may include various materials to configure the common electrode of the side pixel with a material having a relatively small color deviation and the common electrode of the front pixel with another material having a relatively large color deviation.

In the exemplary embodiments of the invention, as described herein, an OLED display has improved visibility at a bent region While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
   a front display part comprising a plurality of front pixels disposed on a substrate, wherein the front pixels display an image on a front surface thereof; and
   a side display part comprising a plurality of side pixels disposed on the substrate, wherein the side pixels display an image on a side surface thereof,
   wherein the front display part and the side display part are configured to have different resonance structures from each other.

2. The organic light emitting diode display of claim 1, wherein
   the front display part has a high resonance structure, and the side display part has a low resonance structure.

3. The organic light emitting diode display of claim 2, wherein each of the pixels of the front display unit and the pixels of the side display unit comprises:
   a plurality of thin film transistors disposed on the substrate;
   a protective layer configured to cover the thin film transistors;
   a first electrode disposed on the protective layer;
   a pixel definition film disposed on the first electrode, wherein an opening, which exposes the first electrode on the protective layer, is defined through the pixel definition film;
   an organic emission layer disposed on the first electrode and in the opening of the pixel definition film; and
   a second electrode configured to cover the organic emission layer,
   wherein the second electrode of the pixels of the side display unit is thinner than the second electrode of the pixels of the front display unit.

4. The organic light emitting diode display of claim 3, wherein the side display part has a thickness which decreases in a direction from the front display part to an end portion of the side display part.

5. The organic light emitting diode display of claim 2, wherein each of the pixels of the front display unit and the pixels of the side display unit comprises:
   a plurality of thin film transistors disposed on the substrate;
   a protective layer configured to cover the thin film transistors;
   a first electrode disposed on the protective layer;
   a pixel definition film disposed on the first electrode, wherein an opening, which exposes the first electrode on the protective layer, is defined through the pixel definition film;
   an organic emission layer disposed on the first electrode and in the opening of the pixel definition film; and
   a second electrode configured to cover the organic emission layer,
   wherein the second electrode of the pixels of the front display unit comprises a material having higher reflectivity than a material of the second electrode of the pixels of the side display unit.

6. The organic light emitting diode display of claim 2, wherein each of the pixels of the front display unit and the pixels of the side display unit comprises:
   a plurality of thin film transistors disposed on the substrate;
   a protective layer configured to cover the thin film transistors;
   a first electrode formed on the protective layer;
   a pixel definition film disposed on the first electrode, wherein an opening, which exposes the first electrode on the protective layer, is defined through the pixel definition film;
   an organic emission layer disposed on the first electrode and in the opening of the pixel definition film; and
   a second electrode configured to cover the organic emission layer,
   wherein the second electrode of the pixels of the front display unit comprises a material having a lower color deviation than a material of the second electrode of the pixels of the side display unit.

* * * * *